United States Patent
Rachakonda et al.

(10) Patent No.: US 9,189,439 B2
(45) Date of Patent: *Nov. 17, 2015

(54) INTERFACE LOGIC FOR A MULTI-CORE SYSTEM-ON-A-CHIP (SOC)

(71) Applicant: INTEL CORPORATION, Santa Clara, CA (US)

(72) Inventors: Ramana Rachakonda, Austin, TX (US); Lance E. Hacking, Austin, TX (US); Mahesh K. Reddy, Austin, TX (US); Lori R. Borger, Phoenix, AZ (US); Chee Hak Teh, Bayan Lepas (MY); Pawitter P. Bhatia, Chandler, AZ (US); John P. Lee, Tenoe, AZ (US)

(73) Assignee: Intel Corporation, Santa Clara, CA (US)

( * ) Notice: Subject to any disclaimer, the term of this patent is extended or adjusted under 35 U.S.C. 154(b) by 47 days.

This patent is subject to a terminal disclaimer.

(21) Appl. No.: 14/141,574

(22) Filed: Dec. 27, 2013

(65) Prior Publication Data

US 2014/0108695 A1 Apr. 17, 2014

Related U.S. Application Data

(63) Continuation of application No. 12/639,258, filed on Dec. 16, 2009, now Pat. No. 8,650,629.

(51) Int. Cl.
*G06F 15/78* (2006.01)
*G06F 13/40* (2006.01)
*G01R 31/3185* (2006.01)

(52) U.S. Cl.
CPC ............ *G06F 13/40* (2013.01); *G06F 15/7842* (2013.01); *G01R 31/318572* (2013.01); *Y02B 60/1225* (2013.01)

(58) Field of Classification Search
None
See application file for complete search history.

(56) References Cited

U.S. PATENT DOCUMENTS

| | | | |
|---|---|---|---|
| 5,534,774 A | 7/1996 | Moore | |
| 6,009,488 A | 12/1999 | Kavipurapu | |
| 7,076,609 B2 | 7/2006 | Garg et al. | |
| 7,853,997 B2 | 12/2010 | Conti | |
| 8,650,629 B2 | 2/2014 | Rachakonda et al. | |
| 2007/0011419 A1 | 1/2007 | Conti | |
| 2007/0255985 A1 | 11/2007 | Ramadorai | |

OTHER PUBLICATIONS

Chinese Office Action for Chinese Application No. 201010615801.0, issued on Dec. 16, 2013.

(Continued)

*Primary Examiner* — David Le
*Assistant Examiner* — Devin Almeida
(74) *Attorney, Agent, or Firm* — Trop, Pruner & Hu, P.C.

(57) ABSTRACT

In one embodiment, the present invention includes a system-on-a-chip (SoC) with first and second cores, interface logic coupled to the cores, chipset logic coupled to the interface logic, and a virtual firewall logic coupled between the chipset logic and the second core. The interface logic may include a firewall logic, a bus logic, and a test logic, and the chipset logic may include a memory controller to provide for communication with a memory coupled to the SoC. In some system implementations, both during test operations and functional operations, the second core can be disabled during normal operation to provide for a single core SoC, enabling greater flexibility of use of the SoC in many different implementations. Other embodiments are described and claimed.

19 Claims, 5 Drawing Sheets

(56) References Cited

OTHER PUBLICATIONS

State Intellectual Property Office, P.R. China, Office Action mailed Apr. 2, 2013 in Chinese application No. 201010615801.0.

European Patent and Trademark Office, Official Letter mailed Apr. 26, 2012 in European Patent Application No. 10 251 973.3-1243.
INTEL, "An Introduction to the Intel Quickpath Interconnect," Jan. 2009, p. 1-22.
Chinese Patent Office, Office Action mailed Jul. 23, 2014, in Chinese Application No. 201010615801.0.

INTERFACE LOGIC FOR A MULTI-CORE SYSTEM-ON-A-CHIP (SOC)

This application is a continuation of U.S. patent application Ser. No. 12/639,258, filed Dec. 16, 2009, the content of which is hereby incorporated by reference.

BACKGROUND

As semiconductor technologies evolve, greater amounts of functionality can be incorporated on a single semiconductor die. Whereas formerly separate integrated circuits may have been present to provide different functions such as processing functions, control functions, interface functions and so forth, modern semiconductors can incorporate multiple functions such as these in a single integrated circuit.

Evidence of this trend is the increasing number of system-on-a-chip (SoC) devices that are available. These single die integrated circuits (ICs) include various circuitry such as processing circuitry, interface circuitry, specialized function circuitry and so forth. As such, embedded devices and portable devices such as mobile terminals, netbooks and so forth can be implemented with a smaller number of devices. This trend is also apparent in processor technologies, as modern processors can include multiple cores in a single package, e.g., dual-core, quad-core and many-core implementations are readily available. In general, SoCs include a single core processor, which can provide a limitation on their utility.

DETAILED DESCRIPTION

In various embodiments, a multi-core system-on-a-chip (SoC) may be provided with interface logic to connect one or more of the integrated cores, also referred to herein as central processing units (CPUs), with an integrated memory controller and associated input/output (IO) buffers. The CPUs, which in one embodiment may be a pair of cores, are coupled to the remainder of the SoC via an internal front side bus (FSB) interconnect. The interface logic further provides for functional and test access as a single core configuration (in addition to dual core) for market and high volume manufacturing (HVM) flexibility. In one embodiment, the interface logic component can connect two CPUs with other chipset logic (e.g., a north bridge controller) in a SoC. The interface logic can be fused to support either a single or dual core product stock keeping unit (SKU).

In one embodiment, this interface logic may thus act to resolve a dual core CPU iFSB (internal front side bus) interface into a single iFSB for communication with chipset logic (e.g., corresponding to a north bridge component having memory controller functionality). In addition, the logic provides an interface and firewall to accommodate dual core CPU design for test (DFX), as well as a firewall to virtually chop one of the cores (e.g., CPU1). The logic may also provide an interface for power-on configuration (POC) overlay from the chipset logic to the independent POC bus on the CPUs, and an interface for direct access test (DAT) overlay from the chipset logic to the independent DAT bus on the CPUs. Still further, the interface logic routes all signals that require a level shift between a core voltage (Vcc) and a SoC voltage (Vnn).

Figure 1:
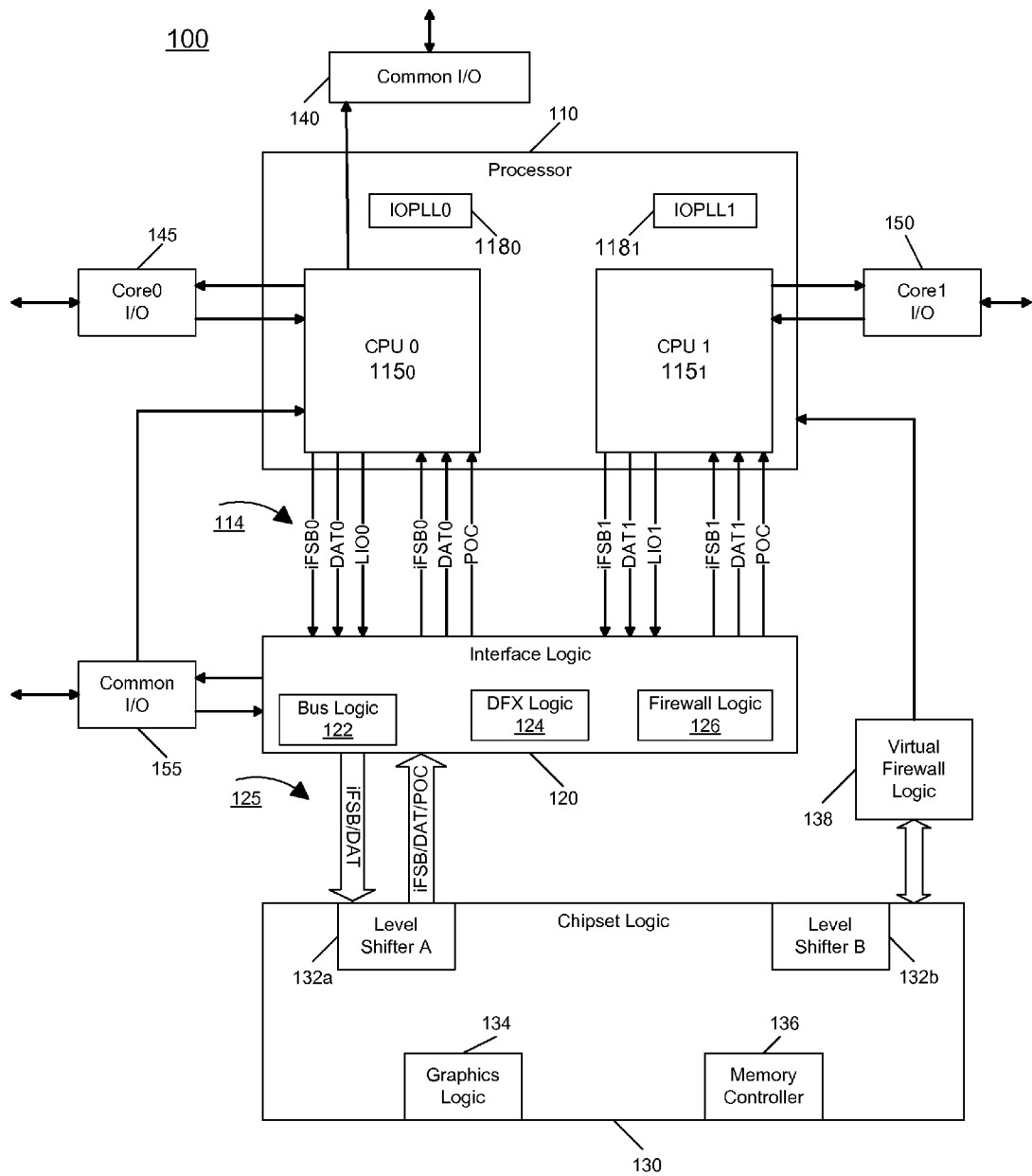
FIG. 1 is a block diagram of a system-on-a-chip (SoC) in accordance with one embodiment of the present invention.

Referring now to FIG. 1, shown is a block diagram of a system on a chip (SoC) in accordance with one embodiment of the present invention. As shown in FIG. 1, SoC 100 may be implemented on a single semiconductor die. In the embodiment shown in FIG. 1, a dual core processor 110 is present, including a first CPU $115_0$ and a second CPU $115_1$. In addition, each CPU has its own phase lock loop (PLL) $118_0$ and $118_1$, which may be used to generate various clock signals to be used by the cores.

As seen, a variety of interconnects couple processor 110 to other components of the SoC. Each CPU may communicate with an interface logic 120 over various interconnects, including an internal frontside bus (iFSB), a direct access test (DAT) interconnect, and legacy IO (LIO) path. Similar FSB and test paths may be coupled from interface logic 120 to each CPU, in addition to power-on configuration (POC) signals. Note that in the embodiment of FIG. 1, the cross-hatching for the components of CPU1 indicate that this processor can be configured to be disabled (i.e., virtually chopped) in a given system implementation. In this way, a common mask set and a single manufacturing process can be used for manufacturing SoCs from a single wafer, and depending on a requirement of a customer (and price level), one or both CPUs can be enabled.

As further shown in FIG. 1, interface logic 120 includes various logic components to provide an interface between processor 110 and other components of the SoC, including a chipset logic 130, which in one embodiment may include various interface and control logic, including a graphics logic 134 and a memory controller 136, which may provide for communication with memory, such as a dynamic random access memory (DRAM) coupled to the SoC. As further seen in FIG. 1, chipset logic 130 further includes chip level functions via level shifters $132_a$ and $132_b$, which act to perform voltage conversion to/from CPU-level voltages (i.e., VCC) and chipset logic voltage (i.e., $V_{NN}$). In various embodiments, chipset logic 130 may have interfaces to off-chip components such as a system memory south bridge, or other interface to peripheral devices.

As seen, interface logic 120 includes a bus logic 122 to handle the various combinational logic to interface signals between chipset logic 130 and interface logic 120 via a first interconnect 125 and to prepare those signals for communication to processor 110, via interconnects 114. In addition, interface logic 120 includes DFX logic 124 to implement various DFX control, which can be communicated to both processor 110 and chipset logic 130. Interface logic 120 also includes a firewall logic 126 to perform firewall operations both during test modes and functional operation to virtually chop CPU $115_1$, if so configured. In other words, this virtual chop converts a dual-core CPU into a single core CPU which could be done using fuses for product differentiation or for testing. Using firewall modes, each core can be independently tested as a single CPU, either one core at a time (e.g., CPU0 or CPU1) or both CPUs can run same test in parallel (as single cores). Note this is another function of the firewall logic 126 for HVM purposes. This is different than virtual chop since it is test mode (not functional mode) such that both CPUs can execute same test in parallel as if each were a single core.

Additional interface logic is present throughout SoC 100. As seen, a separate virtual firewall logic 138 resides between chipset logic 130 and processor 110. This separate logic may use a different power well and thus is shown as a different logic unit, although functionally it may be considered part of firewall logic 126. In addition, various input/output (IO) interfaces may couple certain components to off-chip links. As seen, each core may have an individual IO interface 145 and 150, respectively. Still further, a common IO interface 140 may also couple processor 110 off-chip. Yet another common IO interface 155 may enable a communication path between off-chip components and interface logic 120 and CPU 115. While shown with this particular implementation including a dual-core processor in the embodiment of FIG. 1, understand that the scope of the present invention is not limited in this regard, and in other implementations a multi-core processor including more than two cores may be present, in which one or more of the cores may be configured to be virtually chopped for a given system configuration.

To perform a dual core FSB resolution function, each CPU contains a logical OR with its own feedback signal (in both single and dual core operation). For dual core mode, the logical AND-OR of iFSB interface signals from the second (i.e., other) core and chipset logic can be provided by the interface logic. In this way, each CPU expects to see the signal driven to it from the chipset logic and the other CPU as well as the signal that it drives for the FSB equivalent signals. All signals on the iFSB from the CPU and chipset logic are expected to drive zero when inactive. Since the CPU does not drive zero by default when inactive, this is instead accomplished for the CPU by the interface logic. In some embodiments, there is no sequential logic located in the interface logic (which could affect test access modes), and the CPU clock is not routed through the interface logic.

Figure 2:
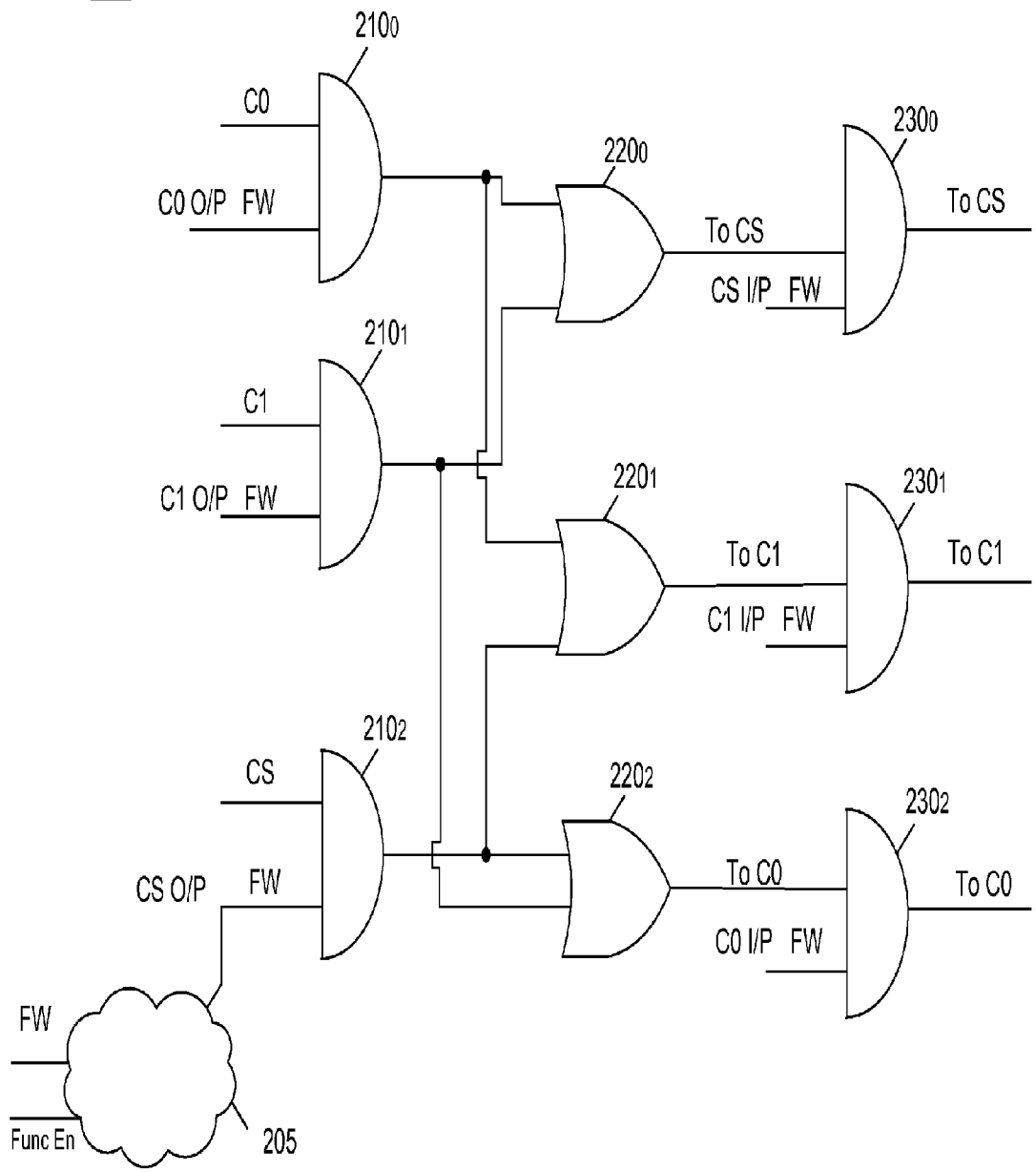
FIG. 2 is a schematic diagram of logic to perform bus resolution in accordance with an embodiment of the present invention.

Referring now to FIG. 2, shown is a schematic diagram of logic to perform FSB resolution in accordance with an embodiment of the present invention. As shown in FIG. 2, logic 200 may be incorporated as part of interface logic 120, e.g., as part of the bus logic 122. In general, logic 200 may be used to perform combinational operations to realize the logical AND-OR as described above. Specifically, as seen a first level of AND logics $210_0$-$210_2$ may be coupled to receive an output signal from the corresponding core (or chipset component) and the corresponding core's output firewall signal. As seen, the output firewall signal may be generated in an independent logic block 205. Note that FIG. 2 shows only one such block for the chipset element, although similar logic is present for the two cores. As seen, this logic block receives a firewall signal along with a functional enable signal, which may be an address enable signal, the output of which acts as an output firewall signal input to the corresponding AND logic 210.

Referring still to FIG. 2, the output of AND logics 210 may be coupled in combination to a second level of OR logics $220_0$-$220_2$ that in turn provides an output to a third level of AND logics $230_0$-$230_2$, which acts to combine the output of OR logic 220 and a corresponding input firewall signal. The corresponding outputs from AND logics 230 are sent to the identified core (or chipset) which thus acts as a logical AND OR of the interface signals from the other core and chipset logic.

As described, embodiments also enable a virtual chop. A virtual core chop (VC) refers to the ability to make a dual-core processor look like a single core processor without physically changing the silicon. This feature can be enabled for production parts and for debug purposes. An SoC may be configured to operate as a single-core product with or without power applied to one of the CPUs (the chopped CPU is referenced herein as CPU1). However in this mode, the power option is not available as a CPU switch. This control can be via a package/motherboard solution that can be implemented by the SoC. When power is removed by the SoC for virtual chop, it is removed from the CPU1 and related components, e.g., IOPLL1 and LGI_CORE1. In one embodiment, CPU0 disables the clocks to CPU1 when it is chopped to minimize power consumption in the event power remains applied.

For a single core chop, in general almost every input and output signal to CPU1 is firewalled. The firewall exceptions are noted below. Input/output signals that are firewalled for the unused CPU1 are forced to '0' (inactive) when a VC indicator is active. In one embodiment, the firewall signal exceptions for CPU1 VC may include the following signals: POWERGOOD, which enables this signal to be deasserted first to allow ring oscillator clocks to clear contention on the CPU1. But later the POWERGOOD is asserted to stop the ring oscillator to save power. A signal CPU1<->LGI_CORE1 is another exception because LGI_CORE1 will also have power removed, or clocks are disabled in VC mode. Another signal, CPU1<->IOPLL1, is another exception, because IOPLL1 will have power removed, or clocks are disabled in VC mode. In addition, certain analog signals including a core clock signal and RESET may be exceptions from the firewall.

In one embodiment, there can be two ways to enable the CPU1 virtual chop. First, a fuse setting within a CPU0 fuse enables CPU1 VC. Two versions of this VC fuse signal may be sent, one to interface logic 120 and one to virtual firewall logic 138. Second, a signal from chipset logic 130 (e.g., a pin strap signal), can be used for optional enable of CPU1 VC. A second version of this strap signal is sent from logic 130 to virtual firewall logic 138. The VC pin strap will be valid a few cycles after the PWROK/CPUPWRGOOD assertion. In one implementation, the signal may default to be disabled such that the second CPU is enabled.

In one embodiment, the two VC enable options can be "ORed" together to create a firewall cell enable signal. In this way, they have equal priority. To clock disable a virtual chopped CPU1, the following may occur. First, the parallel fuses become valid and the VC fuse enable is applied to interface logic 130 and virtual firewall logic 138. Then PWR-GOOD is de-asserted and the ring oscillator clock runs to clear contention on CPU1. PWRGOOD asserts and stops the ring oscillator. Finally, the RESET signal is combined with VC indicators in virtual firewall logic 138 to disable CPU1 clocks. Note that ((~RESET AND (VC fuse OR VC strap)) will enable a DEEPSLEEP signal to CPU1 when RESET de-asserts and VC is enabled. The asserted DEEPSLEEP signal will disable the clocks to CPU1.

DFX logic 124 may be also provided as part of interface logic 120, which may be used to enable dual core test and debug and minimize test pins and routes via multiplexing with functional signals. Logic 124 may provide a DFX firewall to allow concurrent and independent testing of CPU's and SoC logic. The firewall is used to hold CPU input/output signals to a logical '0' so that any signal toggle that may occur during testing is suppressed between CPU0, CPU1, and chipset logic blocks. This is accomplished by logical AND of active signals with a qualifier signal. In one embodiment, CPU JTAG strap signals can be defined to enable DFX firewalls in interface logic 130. For example a JTAG strap is output from CPU1 and input to interface logic 130, and can be used to firewall the outputs of CPU1 in interface logic 130.

For certain test modes, e.g., using a XDP board connector, certain XDP modes may be used for breakpoint monitoring (BPM) or other debug test pins or control outputs from the CPU to the ITP-XDP with virtual chop. Specifically, when BPM pins for CPU0 and CPU1 are wire-ORed on the motherboard and CPU1 is virtually chopped an issue may occur in that electrostatic discharge (ESD) diodes in the powered off BPM_CPU1 pins drag the voltage to ground and the wire-OR will not work. Depending on the type of XDP connector, different modes to resolve this issue can be provided.

In a first mode, i.e., a small-XDP or shared BPM mode, the CORE1 BPM outputs OR with CORE0 BPM outputs. The CORE0 BPM inputs go to both cores. CORE1 BPM inputs and outputs are AND-firewalled in virtual chop mode. CORE1 BPM outputs are AND-firewalled in DFX mode. Small XDP may be the default mode, and only CORE0 BPM pads are used for this shared BPM mode.

In a second mode, i.e., a large-XDP or independent BPM mode, the CORE0 BPM inputs/outputs connect only to CORE0. CORE1 BPM inputs/outputs connect only to CORE1. Large XDP mode can be enabled by a joint test action group (JTAG) strap signal in the core. This strap signal is provided to multiplex between XDP modes. The strap signal enables large-XDP mode when asserted. In both modes, no wire-OR is allowed on the motherboard between BPM_C0 and BPM_C1 (and as such the mid-agent support fuse can be reclaimed).

Figure 3:
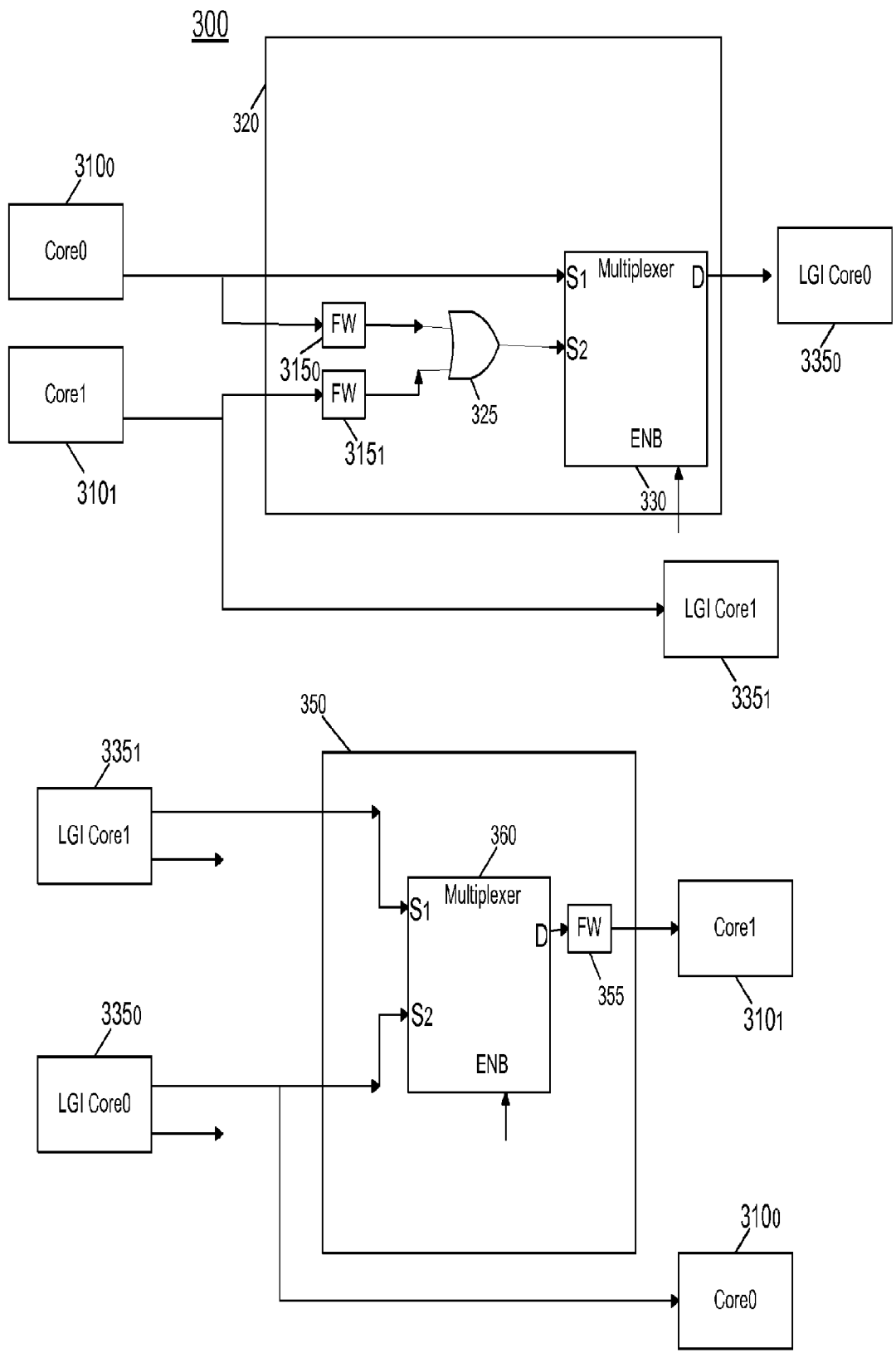
FIG. 3 is a block diagram of test logic in accordance with an embodiment of the present invention.

Referring now to FIG. 3, shown is a block diagram of test logic in accordance with an embodiment of the present invention. As shown in FIG. 3, test logic 300 may be used to control test operations in small and large XDP modes. As seen, interface logic 300 includes an input logic 320 which in one embodiment may be part of DFX logic 124 of interface logic 120. Input logic 320 is coupled to receive incoming outputs from corresponding cores $310_0$ and $310_1$. As seen, each of these outputs is coupled through corresponding firewall logic $315_0$-$315_1$ and to an OR gate 325, the output of which is provided to an input of a multiplexer 330. As seen, the output from core $310_0$ is also directly provided to another input of multiplexer 330. Depending on the test mode (i.e., small-XDP or large-XDP), the output from multiplexer 330 is selected from one of the two inputs and provided to an interface $335_0$, which in turn may be coupled to core $310_0$. In one embodiment, the enable signal ENB may be default at zero for the small XDP mode such that the output of multiplexer 330 may be the OR'ed version output from OR gate 325, while in the large XDP mode, the output from core $310_0$ may be provided to interface logic $335_0$. As seen, the output of core $310_1$ also goes directly to interface logic $335_1$ coupled to core $310_1$.

In addition, FIG. 3 shows an output logic 350, which receives inputs from the inputs to the corresponding cores, i.e., interface logics $335_0$ and $335_1$, and provides a selected output to core $310_1$. As seen, core $310_0$ directly receives its input from the output of interface logic $335_0$. In output logic 350, multiplexer 360 is controlled based upon the mode to output one of the two interface output signals, which is provided through firewall logic 355 to core $310_1$. In one embodiment, the enable signal ENB may be default at zero for the small XDP mode in which the output of multiplexer 360 is from core $335_0$. In the large XDP mode, the ENB signal may be high, causing the output of multiplexer 360 to be from the output of interface logic $335_1$.

In one embodiment, DAT signals from CPU to interface logic 130 can be multiplexed (overlaid) with iFSB signals to reduce routing. The SoC will route the DAT outputs from each CPU to the SoC I/O pads. In this way, a dependency on CPU lock-step operation can be removed. Thus in order to reduce the number of routes in the narrow routing channel in between the two CPU cores, the DFX access buses used for ATPG (scan) and DAT modes can be multiplexed with the functional data bus (i.e., iFSB). In one embodiment, the multiplexing is done on the lower data bits for the CPU-to-chipset logic DFX access bus and the upper data bits for the chipset logic-to-CPU DFX access bus. The basic topology for the DFX access bus multiplexing is shown in FIG. 1. It is assumed that both the ATPG and DAT modes are mutually exclusive, i.e., the test modes will never be executed in parallel, but both the CPU cores can enter the same test mode simultaneously.

Figure 4:
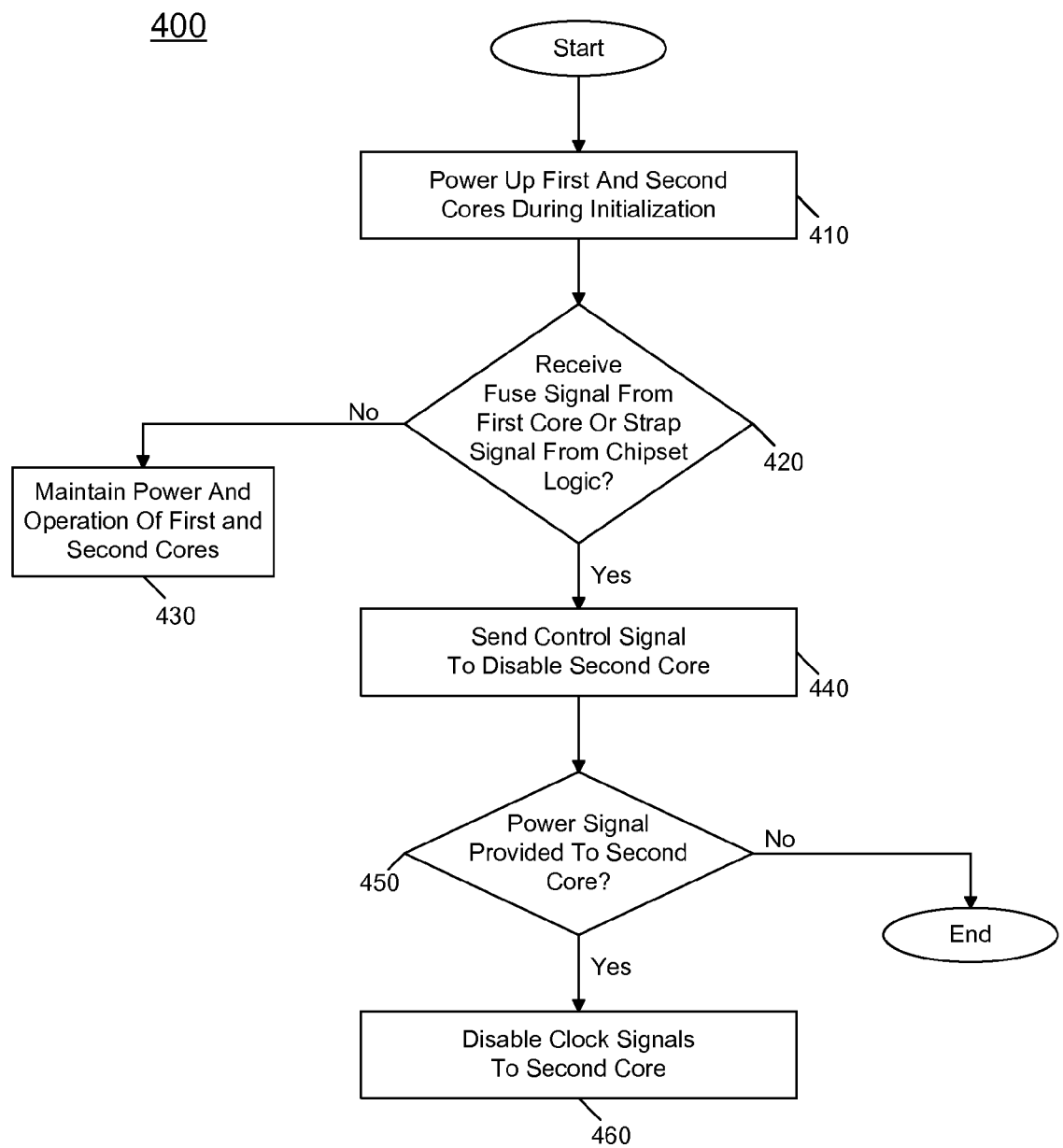
FIG. 4 is a flow diagram of a method in accordance with one embodiment of the present invention.

Referring now to FIG. 4, shown is a flow diagram of a method in accordance with one embodiment of the present invention. As shown in FIG. 4, method 400 may be used to control operation in dual-core or single-core mode of an SoC in accordance with an embodiment of the present invention. As shown in FIG. 4, method 400 may begin by powering up multiple cores of a SoC during initialization (block 410). Such powering up enables various testing to be performed to ensure that both processors are capable of receiving power and that an initialization proceeds properly.

Control then passes to diamond 420 where, e.g., interface logic of the SoC may receive a fuse signal from a first core or a strap signal from chipset logic. If not, this indicates that the SoC is configured for dual-core mode. Accordingly, control passes to block 430 where power and operation of both cores may be maintained. If instead it is determined that at least one of these signals has been received in the interface logic, control may pass to block 440 where a control signal may be sent to disable the second core. Specifically, a virtual chop indicator may be set to indicate that the second core is to be unused. Various manners of disabling this core can be realized. For example, power can be prevented from being applied to the core. In this way, power savings may be realized. Accordingly at diamond 450 it may be determined whether the power is to be provided to the second core. If not, the core is disabled and normal operation of the other core may proceed. If however power is to be applied to both cores, control passes to block 460, where the clock signals for the second core may be disabled to thus prevent its operation. While shown with this particular implementation in the embodiment of FIG. 4, the scope of the present invention is not limited in this regard.

Figure 5:
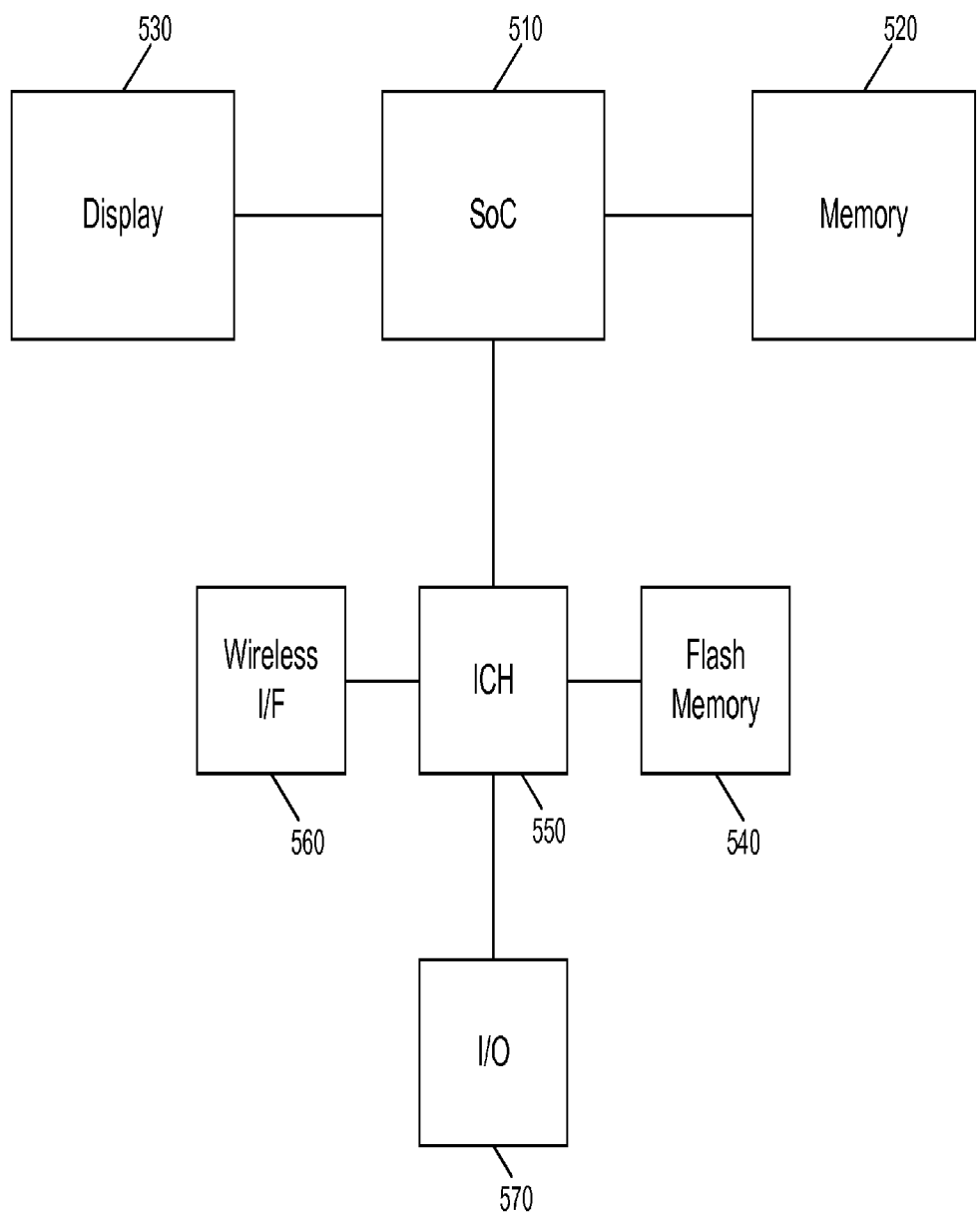
FIG. 5 is a block diagram of a system in accordance with one embodiment of the present invention.

SoCs can be used in many different systems. As one particular example, a SoC in accordance with an embodiment of the present invention can be incorporated into a computer system such as a netbook computer. Referring now to FIG. 5, shown is a block diagram of a system in accordance with one embodiment of the present invention. As shown in FIG. 5, system 500 may be a netbook or other small form factor computer.

As seen, SoC 510 may be a SoC in accordance with an embodiment of the present invention such as described above regarding FIG. 1. A memory 520 which in one embodiment may be dynamic random access memory (DRAM) may be coupled to SoC 510, as the SoC may include an integrated memory controller. In addition, SoC 510 may be coupled to a display 530 such as a liquid crystal display (LCD) or other such display, as the SoC may further include graphics functionality. In addition, SoC 510 may couple to an input/output controller hub (ICH) 550 that in turn may couple to various system components such as a flash memory 540 which in one embodiment may act as a mass storage system for the system, as its small form factor may be appropriate for a netbook or other small device. In addition, ICH 550 may couple to a wireless interface 560 that may enable communication, e.g., via a local area network (LAN) such as a Bluetooth™ connection, a wireless LAN (WLAN) in accordance with Institute of Electrical and Electronics Engineers (IEEE) 802.11 or another such standard. In addition, wireless interface 560 may further enable communication via a wide area network such as a cellular communication network. ICH 550 may further couple to one or more IO devices 570 such as a keyboard, mouse, pointer or other user interface device. While shown with this particular implementation in the embodiment of FIG. 5, the scope of the present invention is not limited in this regard.

Embodiments may be implemented in code and may be stored on a storage medium having stored thereon instructions which can be used to program a system to perform the instructions. The storage medium may include, but is not limited to, any type of disk including floppy disks, optical disks, optical disks, solid state drives (SSDs), compact disk read-only memories (CD-ROMs), compact disk rewritables (CD-RWs), and magneto-optical disks, semiconductor devices such as read-only memories (ROMs), random access memories (RAMs) such as dynamic random access memories (DRAMs), static random access memories (SRAMs), erasable programmable read-only memories (EPROMs), flash memories, electrically erasable programmable read-only memories (EEPROMs), magnetic or optical cards, or any other type of media suitable for storing electronic instructions.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A system-on-a-chip (SoC) comprising:
  a plurality of cores;
  interface logic coupled to the plurality of cores, wherein the interface logic is permanently configured during manufacture to enable the SoC either as a first product stock keeping unit (SKU) with a first number of cores or as a second product SKU with a second number of cores for product differentiation;
  a chipset logic coupled to the interface logic and including a memory controller to provide for communication with a memory coupled to the SoC; and
  a virtual firewall logic coupled between the chipset logic and one or more of the plurality of cores, wherein the one or more cores are to be disabled during normal operation to enable the SoC with the first product SKU based on the permanent configuration of the interface logic for the first product SKU.

2. The SoC of claim 1, wherein the interface logic comprises bus logic to overlay bus signals and direct access test signals from the plurality of cores on a first set of interconnects coupled between the interface logic and the chipset logic.

3. The SoC of claim 2, wherein the chipset logic is to overlay bus signals and direct access test signals to the plurality of cores on a second set of interconnects coupled between the chipset logic and the interface logic.

4. The SoC of claim 2, wherein the bus logic is to further receive and combine outputs from the plurality of cores and the chipset logic and firewall outputs for the plurality of cores and the chipset logic and to provide one of a plurality of combined output signals to each of the plurality of cores and the chipset logic.

5. The SoC of claim 1, wherein the interface logic comprises test logic to receive a first test signal for a first core and a second test signal for a second core and provide the first test signal to the first core and the second core in a first mode and provide the first test signal to the first core and the second test signal to the second core in a second test mode.

6. The SoC of claim 5, wherein the interface logic is to receive a fuse signal from a first core and a strap signal from the chipset logic and to selectively disable the one or more cores based on the fuse signal and the strap signal for the first product SKU.

7. The SoC of claim 6, wherein the interface logic is to combine the fuse signal and the strap signal to generate a disable signal to selectively disable the one or more cores for the first product SKU.

8. The SoC of claim 6, wherein the virtual firewall logic is to receive the fuse signal and the strap signal and to selectively disable the one or more cores based on the fuse signal and the strap signal for the first product SKU.

9. The SoC of claim 1, wherein the one or more cores are to be powered up during initialization, and after the initialization to be selectively disabled.

10. The SoC of claim 1, wherein power is to be applied to the one or more cores when the one or more cores are disabled, and a first core is to disable clock signals to the one or more cores.

11. The SoC of claim 1, wherein power is not to be applied to the one or more cores when the one or more cores are disabled.

12. At least one non-transitory computer-readable storage medium comprising instructions that when executed enable a system to:
  receive a fuse signal in an interface logic of a system-on-a-chip (SoC) including at least a first core and a second core from the first core and a strap signal from a chipset logic of the SoC;
  determine if at least one of the fuse signal and the strap signal is asserted; and
  if so, disable the second core of the SoC to prevent operation of the second core during normal operation of the SoC, wherein the SoC is a multicore SoC and assertion of the fuse signal differentiates the SoC to be a single core product stock keeping unit (SKU) according to a permanent configuration of the SoC during manufacture as the single core product SKU.

13. The at least one non-transitory computer-readable medium of claim 12, further comprising instructions that when executed enable the system to overlay bus signals and direct access test signals from the first and second cores on a first set of interconnects coupled between the interface logic and the chipset logic.

14. The at least one non-transitory computer-readable medium of claim 12, further comprising instructions that when executed enable the system to receive and combine outputs from the first and second cores and the chipset logic and firewall outputs for the first and second cores and the chipset logic and provide one of a plurality of combined output signals to each of the first and second cores and the chipset logic.

15. The at least one non-transitory computer-readable medium of claim 12, further comprising instructions that when executed enable the system to determine if the fuse signal or the strap signal is asserted in the interface logic, wherein the interface logic is coupled between the chipset logic and the first and second cores.

16. A system comprising:
  a system-on-a-chip (SoC) including a first core and a second core, interface logic coupled to the first core and the second core, a chipset logic coupled to the interface logic and including a graphics controller and a memory controller to provide for communication with a memory coupled to the SoC, and a virtual firewall logic coupled between the chipset logic and the second core, wherein the interface logic is permanently configured during manufacture to enable the SoC as either a single core or a dual core product stock keeping unit (SKU) for product differentiation, wherein the second core is to be disabled during normal operation in the single core product SKU; and a dynamic random access memory (DRAM) coupled to the SoC.

17. The system of claim 16, wherein the interface logic is to overlay bus signals and direct access test signals from the first and second cores on a first set of interconnects coupled between the interface logic and the chipset logic.

18. The system of claim 16, wherein the interface logic is to receive and combine a fuse signal from the first core and a strap signal from the chipset logic to generate a disable signal to selectively disable the second core based on the combined fuse and strap signal.

19. The system of claim 16, wherein the interface logic is to control the first core and the second core to independently execute a test program in parallel or to execute the test program one at a time on each of the first core and the second core.

* * * * *